United States Patent
Yamano et al.

(10) Patent No.: US 11,322,478 B2
(45) Date of Patent: May 3, 2022

(54) SEMICONDUCTOR DEVICE AND SEMICONDUCTOR DEVICE ARRAY

(71) Applicant: SHINKO ELECTRIC INDUSTRIES CO., LTD., Nagano (JP)

(72) Inventors: Takaharu Yamano, Nagano (JP); Yoshihiro Ihara, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 40 days.

(21) Appl. No.: 16/855,110

(22) Filed: Apr. 22, 2020

(65) Prior Publication Data

US 2020/0365556 A1 Nov. 19, 2020

(30) Foreign Application Priority Data

May 17, 2019 (JP) .............................. JP2019-093518

(51) Int. Cl.
*H01L 25/00* (2006.01)
*H01L 25/065* (2006.01)
(Continued)

(52) U.S. Cl.
CPC ...... *H01L 25/0655* (2013.01); *H01L 23/3121* (2013.01); *H01L 24/20* (2013.01)

(58) Field of Classification Search
CPC ..... H01L 21/561; H01L 21/563; H01L 23/12; H01L 23/3121; H01L 24/11; H01L 24/13; H01L 24/16; H01L 24/20; H01L 24/29; H01L 24/32; H01L 24/73; H01L 24/81; H01L 24/83; H01L 24/92; H01L 24/97; H01L 25/0655; H01L 25/0753; H01L 25/167; H01L 33/62; H01L 23/3114;
(Continued)

(56) References Cited

U.S. PATENT DOCUMENTS 6,429,530 B1 * 8/2002 Chen ................... H01L 23/3114
257/778
7,223,981 B1 5/2007 Capote et al.
(Continued)

FOREIGN PATENT DOCUMENTS

JP 2000-357768 12/2000
JP 2011-146519 7/2011

OTHER PUBLICATIONS

Extended European Search Report dated Oct. 13, 2020 issued with respect to the corresponding European Patent Application No. 20173069.4.

*Primary Examiner* — Shouxiang Hu
(74) *Attorney, Agent, or Firm* — IPUSA, PLLC (57) ABSTRACT

A semiconductor device includes a wiring substrate and multiple semiconductor chips mounted on the wiring substrate by flip chip bonding with a resin being interposed between the wiring substrate and the semiconductor chips. The wiring substrate includes a chip mounting region in which the semiconductor chips are arranged in a matrix, and a resin injection region protruding from an end of the chip mounting region. The outer edge of the wiring substrate in the chip mounting region is positioned inward of the outer edge of the semiconductor chips arranged in the matrix. The outer edge of the wiring substrate in the resin injection region protrudes outward of the outer edge of the semiconductor chips arranged in the matrix.

7 Claims, 9 Drawing Sheets

(51) Int. Cl.
*H01L 23/31* (2006.01)
*H01L 23/00* (2006.01)

(58) Field of Classification Search
CPC . H01L 2224/11334; H01L 2224/13294; H01L 2224/133; H01L 2224/32013; H01L 2224/81395; H01L 2224/13111; H01L 2224/13113
See application file for complete search history.

(56) References Cited

U.S. PATENT DOCUMENTS

| | | | |
|---|---|---|---|
| 2006/0226527 A1* | 10/2006 | Hatano | H01L 25/0655 257/686 |
| 2008/0136003 A1* | 6/2008 | Pendse | H01L 21/563 257/686 |
| 2009/0020874 A1* | 1/2009 | Watanabe | H01L 21/563 257/737 |
| 2010/0044856 A1 | 2/2010 | Sri-Jayantha et al. | |
| 2012/0256322 A1 | 10/2012 | Itou et al. | |
| 2014/0151891 A1* | 6/2014 | Takano | H01L 23/49833 257/773 |
| 2014/0321804 A1* | 10/2014 | Thacker | H01L 25/0655 385/14 |

* cited by examiner

SEMICONDUCTOR DEVICE AND SEMICONDUCTOR DEVICE ARRAY

CROSS-REFERENCE TO RELATED APPLICATION

This application is based upon and claims priority to Japanese patent application No. 2019-093518, filed on May 17, 2019, the entire contents of which are incorporated herein by reference.

FIELD

A certain aspect of the embodiments discussed herein is related to semiconductor devices and semiconductor device arrays.

BACKGROUND

Semiconductor device arrays in which semiconductor devices having semiconductor chips mounted in a matrix on a wiring substrate by flip chip bonding are arranged in an array have been known. Such semiconductor device arrays may be used as, for example, detectors to detect predetermined electromagnetic waves or the like.

According to such semiconductor device arrays, in order to as tightly arrange the semiconductor devices as possible, the entirety of the outer edge of the wiring substrate is positioned inward of the outer edge of the matrix of the semiconductor chips in each semiconductor device. (See, for example, Japanese Laid-open Patent Publication No. 2011-146519.)

SUMMARY

According to an aspect of the invention, a semiconductor device includes a wiring substrate and multiple semiconductor chips mounted on the wiring substrate by flip chip bonding with a resin being interposed between the wiring substrate and the semiconductor chips. The wiring substrate includes a chip mounting region in which the semiconductor chips are arranged in a matrix, and a resin injection region protruding from an end of the chip mounting region. The outer edge of the wiring substrate in the chip mounting region is positioned inward of the outer edge of the semiconductor chips arranged in the matrix. The outer edge of the wiring substrate in the resin injection region protrudes outward of the outer edge of the semiconductor chips arranged in the matrix.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

In the case of mounting the semiconductor chips on the wiring substrate by flip chip bonding in the above-described semiconductor devices, underfill resin is poured and cured between the wiring substrate and the semiconductor chips to improve the reliability of the connection of the wiring substrate and the semiconductor chips.

According to the above-described structure where the entirety of the outer edge of the wiring substrate is positioned inward of the outer edge of the matrix of the semiconductor chips, however, it is extremely difficult to pour underfill resin between the wiring substrate and the semiconductor chips from a needle.

According to an aspect of the invention, it is possible to provide a semiconductor device whose structure is suitable for as tight arrangement as possible and facilitates pouring underfill resin.

Embodiments of the invention are explained below with reference to the accompanying drawings. In the drawings, identical components are referred to using the same reference numeral, and duplicate description thereof may be omitted.

[a] First Embodiment

Figure 1A:
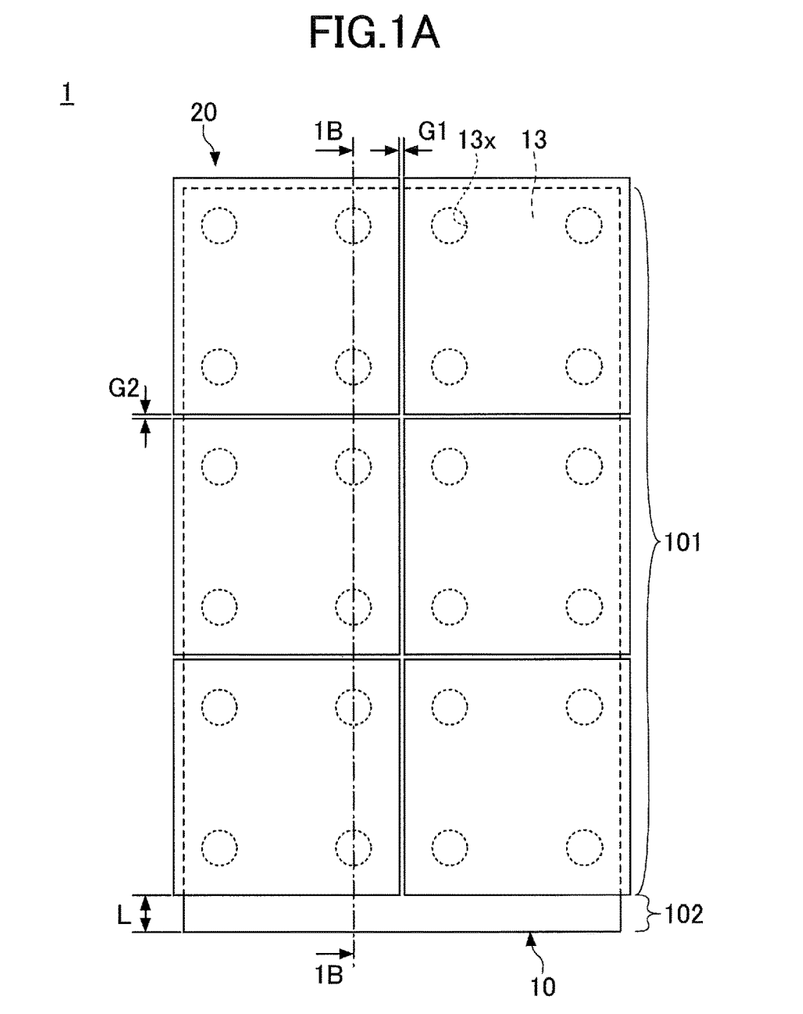
FIGS. 1A and 1B are diagrams illustrating a semiconductor device according to a first embodiment.
Figure 1B:
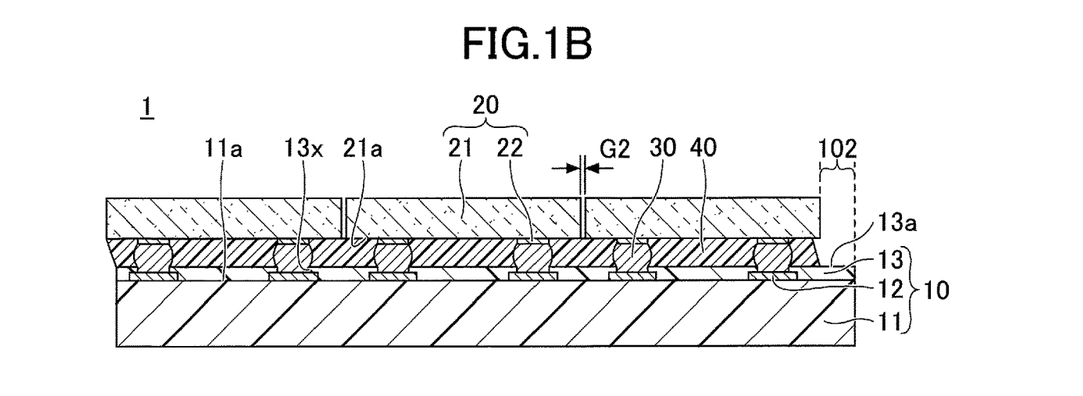

A structure of a semiconductor device according to a first embodiment is described. FIGS. 1A and 1B are a plan view and a sectional view taken along the line 1B-1B of FIG. 1A, respectively, of a semiconductor device 1 according to the first embodiment.

Referring to FIGS. 1A and 1B, the semiconductor device 1 includes a wiring substrate 10, semiconductor chips 20, bumps 30, and underfill resin 40. The wiring substrate 10 includes an insulating layer 11, a wiring layer 12, and a solder resist layer 13. The wiring substrate 10 may suitably include a wiring layer on the opposite side of the insulating layer 11 from the wiring layer 12 and in the insulating layer 11. The wiring layers may be interconnected by via interconnects.

According to this embodiment, for convenience of description, the semiconductor chip 20 side of the semiconductor device 1 is referred to as "upper side" or "first side," and the insulating layer 11 side of the semiconductor device 1 is referred to as "lower side" or "second side." Furthermore, with respect to each part or element of the semiconductor device 1, a surface on the semiconductor chip 20 side is referred to as "upper surface" or "first surface," and a surface on the insulating layer 11 side is referred to as "lower surface" or "second surface." The semiconductor device 1, however, may be used in an inverted position or oriented at any angle. Furthermore, a plan view refers to a view of an object taken in a direction normal to a first surface 11a of the insulating layer 11, and a planar shape refers to the shape of an object viewed in a direction normal to the first surface 11a of the insulating layer 11 or a surface substantially parallel to the first surface 11a, such as the upper surface of the wiring substrate 10.

Figure 2:
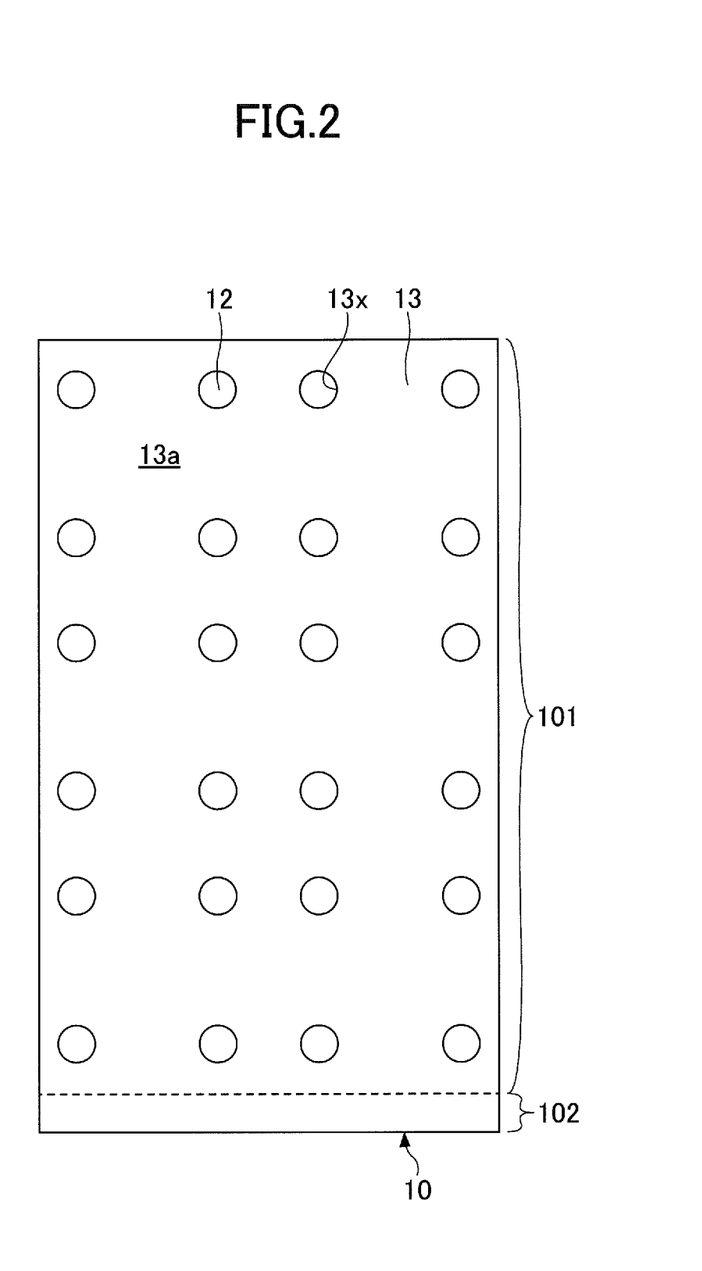
FIG. 2 is a plan view of a wiring substrate of the semiconductor device.

FIG. 2 is a plan view of the wiring substrate 10. Referring to FIG. 2, the wiring substrate 10 includes a chip mounting region 101 in which the semiconductor chip 20 are mounted in a matrix (arrangement). Here, the chip mounting region 101 is a region of the wiring substrate 10 hidden by the individual semiconductor chips 20 in a plan view when the semiconductor chips 20 are mounted in a matrix. The chip mounting region 101 may be demarcated such that a desired number of semiconductor chips 20 can be mounted in a matrix. By way of example, according to this embodiment, the chip mounting region 101 is demarcated such that the six semiconductor chips 20 can be mounted in a 3×2 matrix.

The wiring substrate 10 further includes a resin injection region 102 (a first protruding region) protruding (extending) from one end (the lower end in FIG. 2) of the chip mounting region 101. The resin injection region 102 is used when the underfill resin 40 is formed. The planar shape of the resin injection region 102 may be, but is not limited to, for example, an elongated rectangle.

Referring back to FIGS. 1A and 1B, according to the wiring substrate 10, the resin layer 11 may be formed of, for example, an insulating resin such as an epoxy resin, an imide resin, a phenolic resin, or a cyanate resin. The insulating resin of the insulating layer 11 may be a thermosetting resin or a photosensitive resin. The insulating layer 11 may contain a reinforcing member. Examples of reinforcing members include a woven or non-woven fabric of glass fibers, carbon fibers, aramid fibers or the like. The insulating layer 11 may contain a filler such as silica ($SiO_2$). The thickness of the insulating layer 11 is, for example, approximately 50 μm to approximately 500 μm.

The wiring layer 12 is formed on the first surface 11a of the insulating layer 11. The wiring layer 12 includes pads connected to the semiconductor chips 20 and may include other wiring patterns on an as-needed basis. Suitable materials for the wiring layer 12 include, for example, copper (Cu). The thickness of the wiring layer 12 is, for example, approximately 5 μm to approximately 20 μm.

The solder resist layer 13 is so formed on the first surface 11a of the insulating layer 11 as to cover the wiring layer 12. The solder resist layer 13 may be formed of, for example, a photosensitive resin such as a photosensitive epoxy or acrylic resin. The thickness of the solder resist layer 13 is, for example, approximately 15 μm to approximately 35 μm.

The solder resist layer 13 may be formed by curing either film or liquid resin, and is preferably formed by curing film resin. Compared with the case of using liquid resin, in the case of using film resin, the flatness of an upper surface 13a of the solder resist layer 13 is improved so that the underfill resin 40 is poured with better fluidity.

The solder resist layer 13 includes openings 13x, in which part of the upper surface of the wiring layer 12 is exposed. The planar shape of the openings 13x is, for example, a circle. A metal layer may be formed or anti-oxidation treatment such as an organic solderability preservative (OSP) process may be performed on the upper surface of the wiring layer 12 exposed in the openings 13x on an as-needed basis. Examples of metal layers include a gold (Au) layer, a Ni/Au layer (a laminated metal layer of a nickel [Ni] layer and a Au layer stacked in this order), and a Ni/Pd/Au layer (a laminated metal layer of a Ni layer, a palladium [Pd] layer, and a Au layer stacked in this order).

In the chip mounting region 101, the semiconductor chips 20 are mounted (face down) in a matrix on the wiring substrate 10 by flip chip bonding with respective circuit formation surfaces 21a facing toward the solder resist layer 13.

Specifically, electrode pads 22 of each semiconductor chip 20 are electrically connected to the wiring layer 12 exposed in the openings 13x through the bumps 30. The bumps 30 are, for example, solder bumps. Suitable materials for solder bumps include, for example, alloys containing lead (Pb), tin-copper (Sn—Cu) alloys, tin-silver (Sn—Ag) alloys, tin-silver-copper (Sn—Ag—Cu) alloys, and tin-bismuth (Sn—Bi) alloys.

An interval G1 between the semiconductor chips 20 in adjacent columns is, for example, approximately 30 μm to approximately 100 μm. An interval G2 between the semiconductor chips 20 in adjacent rows is, for example, approximately 30 μm to approximately 100 μm.

Each semiconductor chip 20 includes a body 21 including a semiconductor integrated circuit, and the electrode pads 22 provided on the circuit formation surface 21a of the body 21. The functions of the semiconductor chips 20 are not limited in particular. The semiconductor chips 20 are not limited in particular in size, and are, for example, approximately 10 mm in length, approximately 10 mm in width, and approximately 100 μm to approximately 300 μm in thickness.

The upper surface 13a of the solder resist layer 13 of the wiring substrate 10 and the circuit formation surfaces 21a of the semiconductor chips 20 face each other across the underfill resin 40 interposed between the upper surface 13a (the upper surface of the wiring substrate 10) and the circuit formation surfaces 21a. The distance between the upper surface 13a and the circuit formation surfaces 21a is, for example, approximately 70 μm to approximately 100 μm.

According to this embodiment, by way of example, the six semiconductor chips 20 each including four of the electrode pads 22 are mounted. Therefore, the twenty-four (4×6) openings 13x are formed in the chip mounting region 101 of the wiring substrate 10, and part of the upper surface of the wiring layer 12 is exposed in each opening 13x. The electrode pads 22 of the semiconductor chips 20 are electrically connected through the bumps 30 to the wiring layer 12 exposed in the openings 13x that are at positions corresponding to the electrode pads 22.

Here, the positional relationship between the outer edge of the wiring substrate 10 and the outer edge of the semiconductor chips 20 mounted in a matrix is described.

Referring to FIGS. 1A, 1B and 2, the outer edge (perimeter) of the wiring substrate 10 except for the outer edge (perimeter) of the resin injection region 102, namely, the outer edge of the wiring substrate 10 in the chip mounting region 101, is positioned inward of the outer edge of the semiconductor chips 20 mounted in a matrix.

Here, the outer edge of the wiring substrate 10 except for the outer edge of the resin injection region 102 is indicated by the dashed line in FIG. 1A and the solid line in FIG. 2 in the chip mounting region 101. For example, assuming that the chip mounting region 101 is a quadrangle, the portion of the wiring substrate 10 indicated by the dashed line in FIG. 1A and the solid line in FIG. 2 is the three sides of the chip mounting region 101 other than the side on which the resin injection region 102 is provided.

According to FIGS. 1A, 1B and 2, the chip mounting region 101 extends to the outer edge of the wiring substrate 10. Therefore, the outer edge of the wiring substrate 10 except for the outer edge of the resin injection region 102 may be rephrased as the outer edge of the chip mounting region 101 except for the outer edge of the resin injection region 102.

The outer edge of the semiconductor chips 20 mounted in a matrix (hereinafter, "the outer edge of the matrix of the semiconductor chips 20") is a line connecting sides of the semiconductor chips 20 that do not face adjacent semiconductor chips 20, and is, for example, the four sides of a quadrangle.

The outer edge of the wiring substrate 10 in the resin injection region 102 protrudes outward of (relative to) the outer edge of the matrix of the semiconductor chips 20. An amount of protrusion L of the resin injection region 102 from the outer edge of the matrix of the semiconductor chips 20 is, for example, 1 mm or more, and preferably, 1 mm to 2 mm. The resin injection region 102 can satisfactorily implement its function with the amount of protrusion L of 1 mm or more.

Next, a method of manufacturing a semiconductor device according to the first embodiment is described. FIGS. 3A through 3D are diagrams illustrating a process of manufacturing a semiconductor device according to the first embodiment.

Figure 3A:
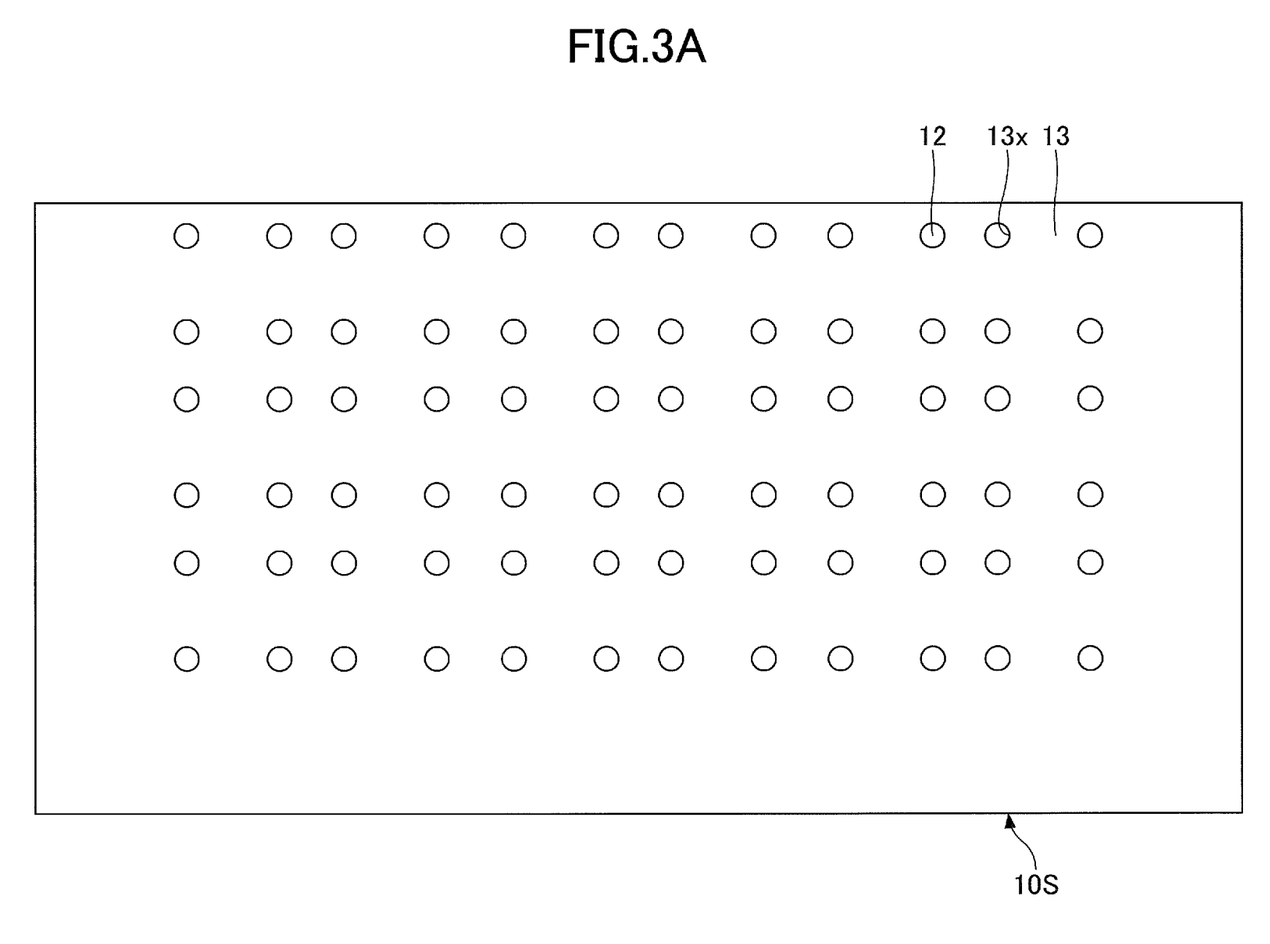
FIGS. 3A through 3D are diagrams illustrating a process of manufacturing a semiconductor device according to the first embodiment.

First, in the process depicted in FIG. 3A, a sheet-shaped wiring substrate 10S is prepared. The wiring substrate 10S includes regions to ultimately become the wiring substrates 10. Each wiring substrate 10 has a sectional structure as illustrated in FIG. 1B.

Figure 3B:
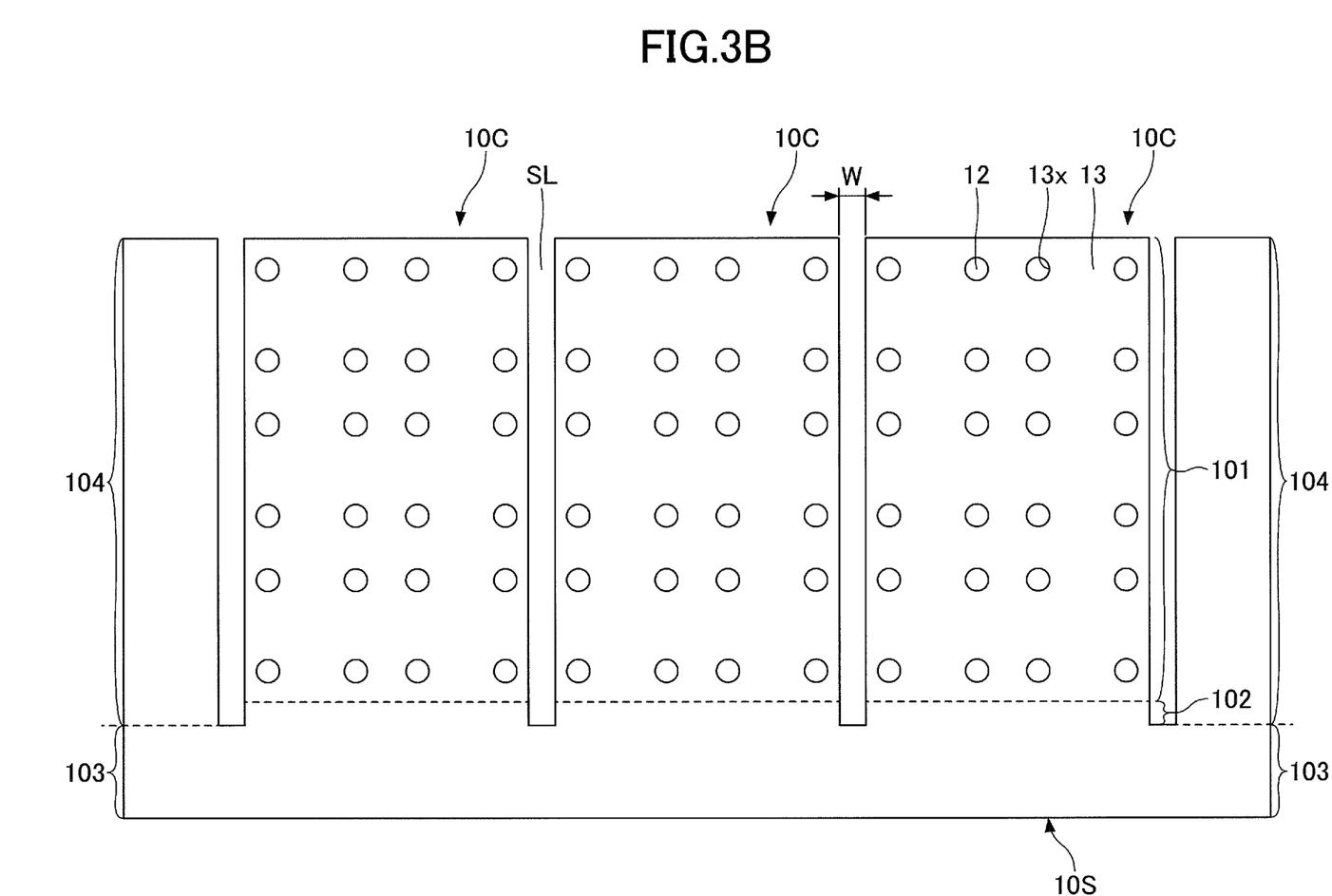

Next, in the process depicted in FIG. 3B, parallel slits (cuts) SL are formed in the sheet-shaped wiring substrate 10S from the same direction to form a connecting portion 103, individual piece regions 10C, and excess regions 104. The slits SL have a width W of, for example, approximately 1 mm. As a non-limiting example, the three individual piece regions 100 and the two excess regions 104 are formed with the four slits SL in FIG. 3B.

The connecting portion 103 is a region not reached by the slits SL, and is elongated along a lateral (long) side of the wiring substrate 10S.

The individual piece regions 100 are separated from one another by the slits SL to protrude in the same direction from a lateral (long) side of the connecting portion 103. That is, the individual piece regions 10C are connected at one end by the connecting portion 103, and are not connected at the other end (opposite from the connecting portion 103).

The individual piece regions 100 are ultimately separated into individual pieces to each become the wiring substrate 10. In each individual piece region 100, the chip mounting region 101 for mounting the semiconductor chips in a matrix and the resin injection region 102 adjoining to one end of the chip mounting region 101 are formed. That is, the slits SL are formed to be longer than the chip mounting region 101 to allow the resin injection region 102 to be provided.

The excess regions 104 are placed one at each longitudinal end of the wiring substrate 10S to be opposite each other across the individual piece regions 100. Each excess region 104 is separated from the adjacent individual piece region 100 by the corresponding slit SL to protrude from the lateral side of the connecting portion 103 in the same direction as the individual piece regions 100. The excess regions 104, however, are an excess portion determined by the relationship between the size of the sheet-shaped wiring substrate 10S and the size and the number of individual piece regions 100 to form. Therefore, the number of excess regions 104 could be one or zero depending on their size relationship.

Figure 3C:
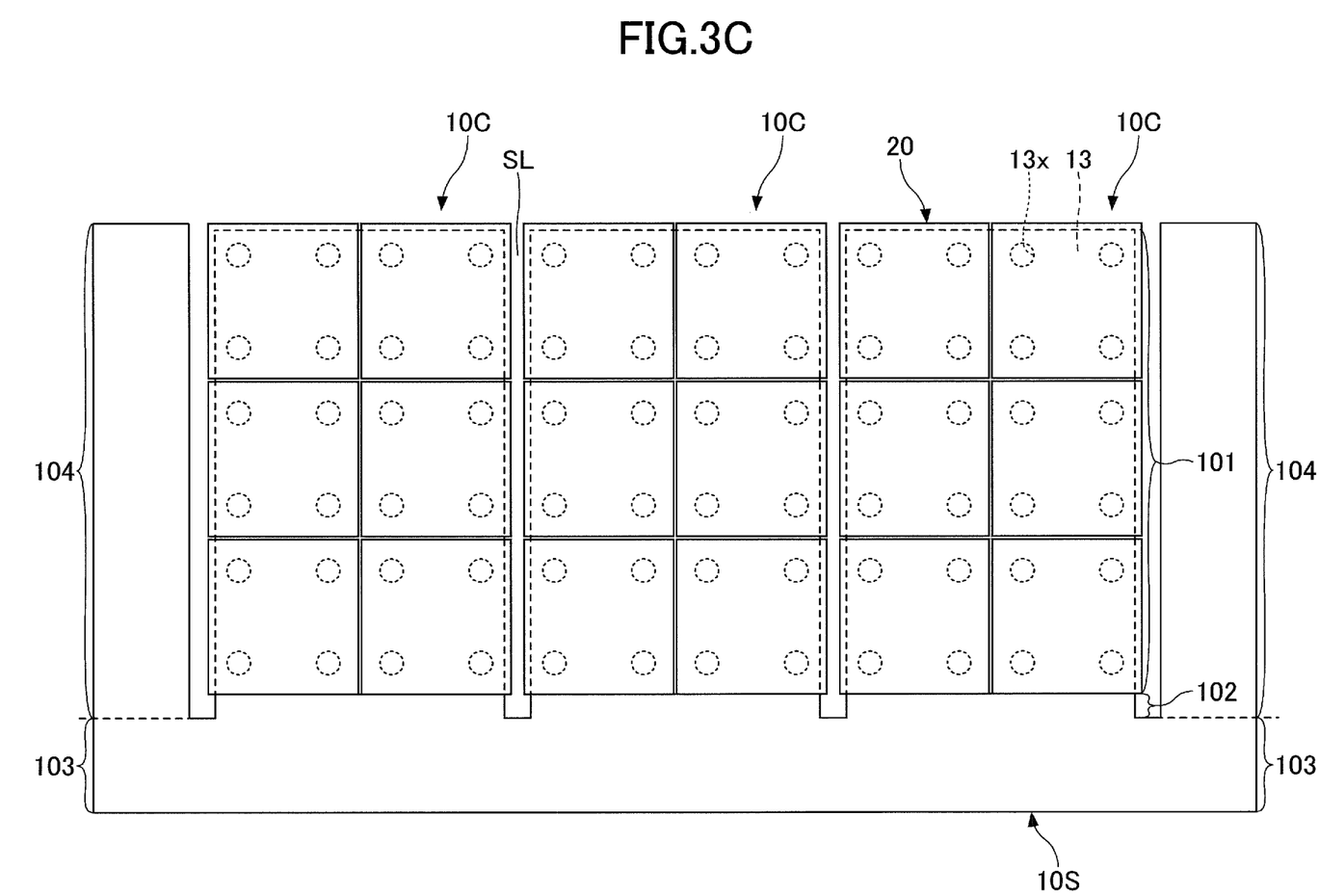

Next, in the process depicted in FIG. 3C, the semiconductor chips 20 are mounted in a matrix in each individual piece region 10C by flip chip bonding. Specifically, for example, solder cream or the like to become the bumps 30 is printed or applied on the upper surface of the wiring layer 12 exposed in the openings 13x, and the semiconductor chips 20 are placed in each individual piece region 10C such that the electrode pads 22 are positioned on the solder cream.

The solder cream is melted by reflow or the like and is thereafter cured to form the bumps 30. As a result, the electrode pads 22 are connected to the wiring layer 12 by the bumps 30, so that the semiconductor chips 20 are mounted in the individual piece regions 10C by flip chip bonding. The bumps 30 may also be formed by placing solder balls instead of solder cream and performing a reflow process.

As a result, the outer edge of each wiring substrate 10 (individual piece region 10C) except for the resin injection region 102 is positioned inward of the outer edge of the matrix of the semiconductor chips 20, and the resin injection region 102 protrudes outward of the outer edge of the matrix of the semiconductor chips 20.

Figure 3D:
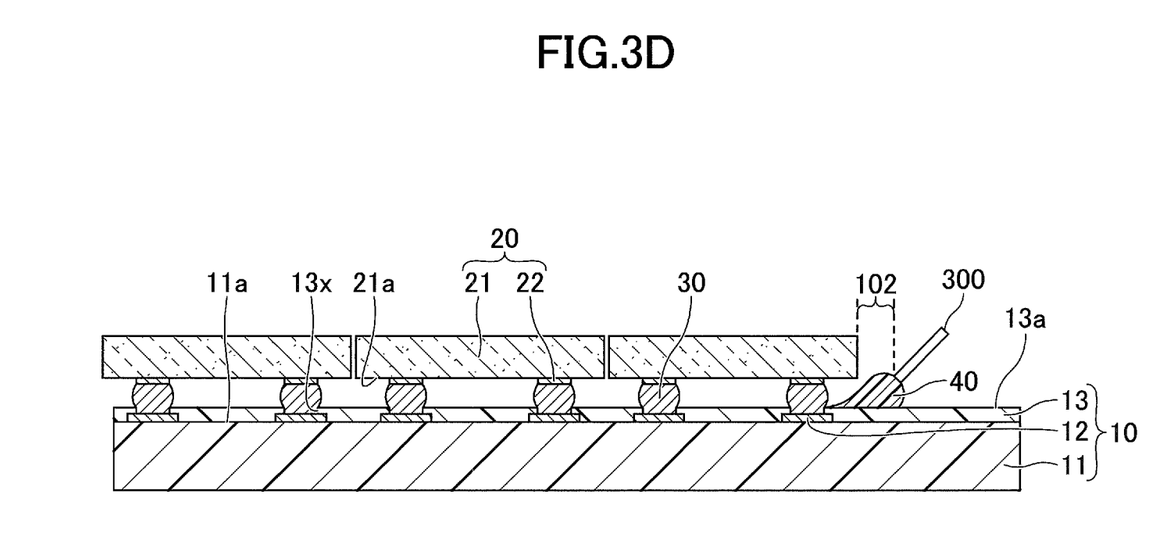

Next, in the process depicted in FIG. 3D, the underfill resin 40 is poured (injected) and cured between a surface of each individual piece region 10C and surfaces of the semiconductor chips 20 that face (are opposite) each other. Specifically, a needle 300 that can discharge the underfill resin 40 is prepared, and is placed near the resin injection region 102 of one of the individual piece regions 10C. The underfill resin 40 is discharged from the needle 300 to be poured between the opposite surfaces of the individual piece region 100 and the semiconductor chips 20 from the resin injection region 102.

The underfill resin 40 spreads between the opposite surfaces of the individual piece region 100 and the semiconductor chips 20 through capillary action. Likewise, the underfill resin 40 is poured from the resin injection region 102 of one after another of the other individual piece regions 100, and is finally heated to a predetermined temperature to be cured.

It is possible to prevent the underfill resin 40 from flowing out of the opposite side of each individual piece region 100 from the resin injection region 102 by adjusting the conditions of its discharge from the needle 300.

It is assumed that none of the individual piece regions 100 is provided with the resin injection region 102 and that the underfill resin 40 is poured from a position inward of the outer edge of the matrix of the semiconductor chips 20 (as is referred to as a structure where the entirety of the outer edge of a wiring substrate is positioned inward of the outer edge of semiconductor chips mounted in a matrix). In this case, even when the underfill resin 40 is discharged from the needle 300, it is difficult to pour the underfill resin 40 between the opposite surfaces of the individual piece regions 100 and the semiconductor chips 20.

In contrast, according to this embodiment, each individual piece region 100 is provided with the resin injection region 102, which serves as a space for starting to pour the underfill resin 40 between the opposite surfaces of the individual piece region 100 and each semiconductor chip 20. Therefore, it is possible to easily pour the underfill resin 40 between the opposite surfaces of the individual piece regions 100 and the semiconductor chips 20.

After the process illustrated in FIG. 3D, the connecting portion 103 and the excess regions 104 are cut off and removed using a slicer or the like, so that the individual piece regions 10C are separated into individual pieces and multiple semiconductor devices 1 are completed.

Thus, according to the semiconductor device 1, the wiring substrate 10 includes the chip mounting region 101 in which the semiconductor chips 20 are mounted in a matrix, and the resin injection region 102 protruding from one end of the chip mounting region 101. The outer edge of the wiring substrate 10 except for the outer edge of the resin injection region 102 is positioned inward of the outer edge of the matrix of the semiconductor chips 20. Furthermore, the resin injection region 102 protrudes outward of the outer edge of the matrix of the semiconductor chips 20.

According to this structure, the semiconductor devices 1 can be as tightly arranged in an array as possible by arranging the semiconductor devices 1 such that respective sides of the semiconductor devices 1 from which sides their respective wiring substrates 10 do not protrude are adjacent to each other.

Furthermore, according to the semiconductor device 1, the wiring substrate 10 includes the resin injection region 102 that protrudes outward of the outer edge of the matrix of the semiconductor chips 20. This makes it possible to easily pour the underfill resin 40 between the opposite surfaces of the wiring substrate 10 and the semiconductor chips 20.

Next, a variation according to the first embodiment is described. The variation is different from the first embodiment in the positional relationship between the outer edge of a wiring substrate and the outer edge of semiconductor chips arranged in a matrix. In the description of the variation, a description of the same components as those of the above-described embodiment may be omitted.

Figure 4A:
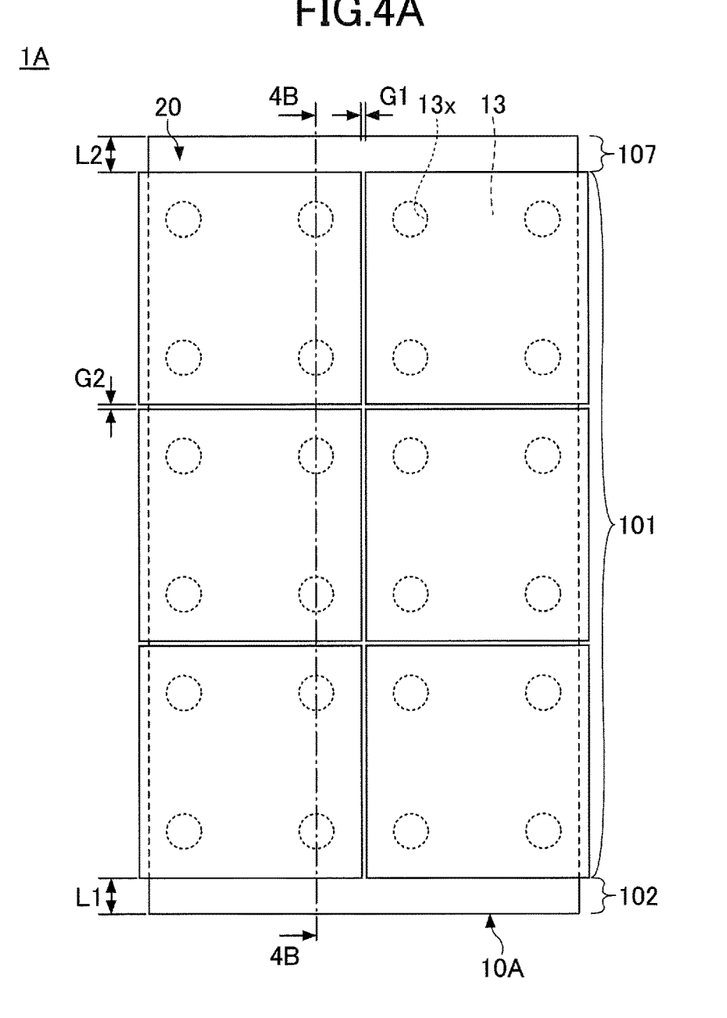
FIGS. 4A and 4B are diagrams illustrating a semiconductor device according to a variation of the first embodiment.
Figure 4B:
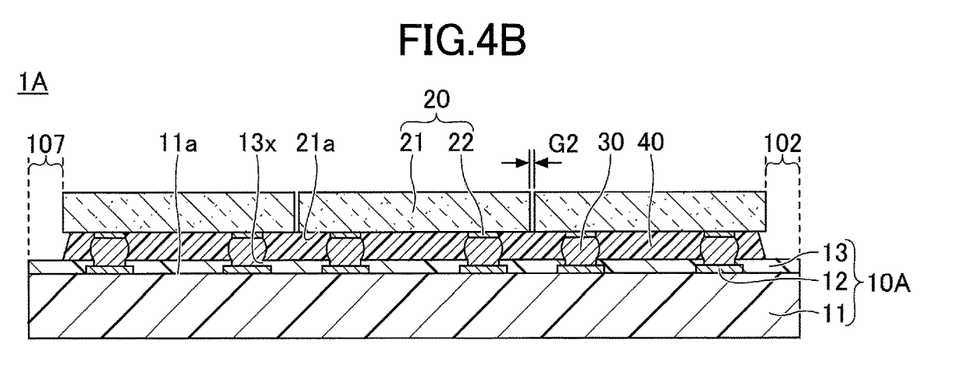

FIGS. 4A and 4B are a plan view and a sectional view taken along the line 4B-4B of FIG. 4A, respectively, of a semiconductor device 1A according to the variation.

Referring to FIGS. 4A and 4B, the semiconductor device 1A is different from the semiconductor device 1 (FIGS. 1A and 1B) in that the wiring substrate 10 is replaced with a wiring substrate 10A.

Like the wiring substrate 10, the wiring substrate 10A includes the resin injection region 102 protruding from one end (the lower end in FIG. 4A) of the chip mounting region 101. The resin injection region 102 is used when the underfill resin 40 is formed. Unlike the wiring substrate 10, the wiring substrate 10A includes an opposite region 107 (a second protruding region) protruding (extending) from the other end (the upper end in FIG. 4A) of the chip mounting region 101. The opposite region 107 is opposite (faces) the resin injection region 102 across the chip mounting region 101.

In the opposite region 107, the outer edge of the wiring substrate 10A protrudes outward of (relative to) the outer edge of the matrix of the semiconductor devices 20. The outer edge of the wiring substrate 10A except for the outer edge of the resin injection region 102 and the outer edge of the opposite region 107 (namely, the outer edge of the wiring substrate 10A in the chip mounting region 101 indicated by the dashed line in FIG. 4A) is positioned inward of the outer edge of the matrix of the semiconductor chips 20.

An amount of protrusion L1 of the resin injection region 102 from the outer edge of the matrix of the semiconductor chips 20 is, for example, 1 mm or more, and preferably, 1 mm to 2 mm. An amount of protrusion L2 of the opposite region 107 from the outer edge of the matrix of the semiconductor chips 20 may be determined as desired, but is, for example, 1 mm or more, and preferably, 1 mm to 2 mm, in the case of pouring the underfill resin 40 from the opposite region 107 side.

Figure 5A:
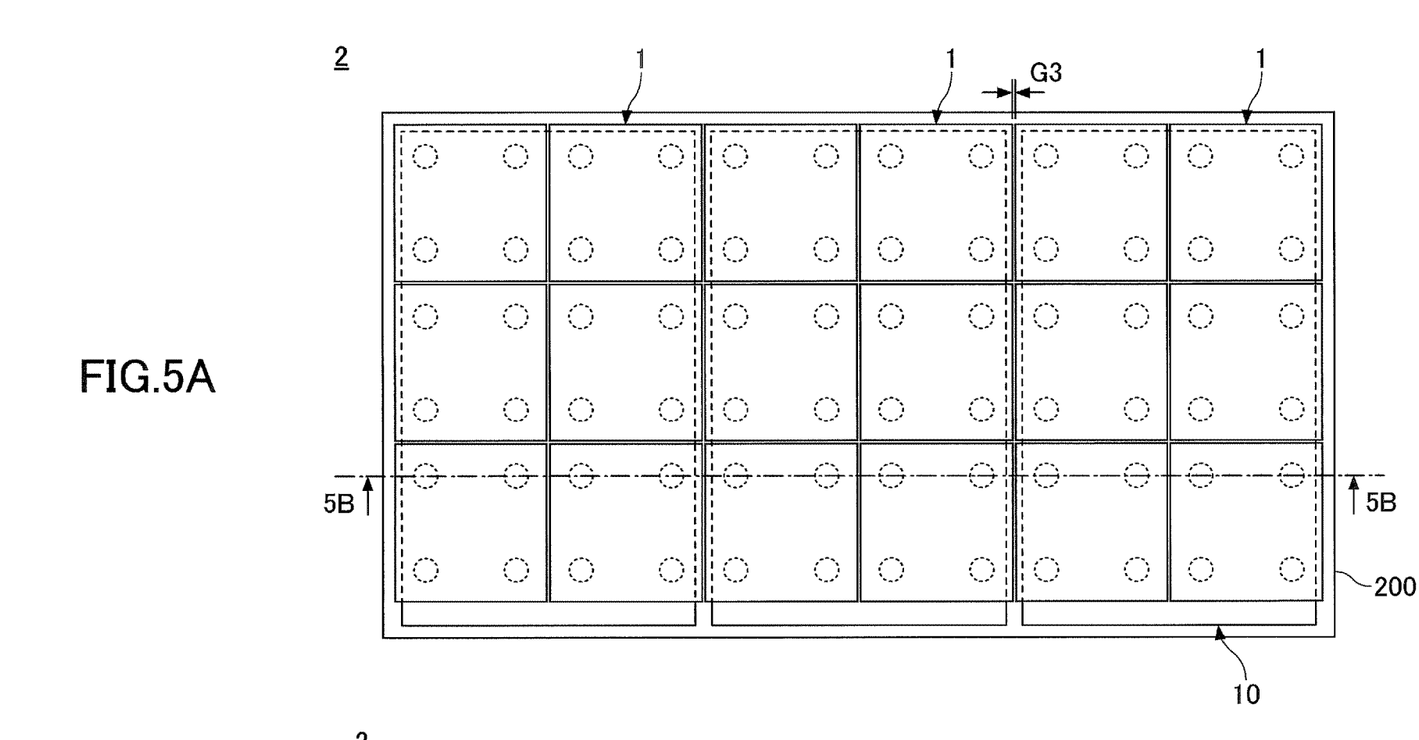
FIGS. 5A and 5B are diagrams illustrating a semiconductor device array according to a second embodiment.
Figure 5B:
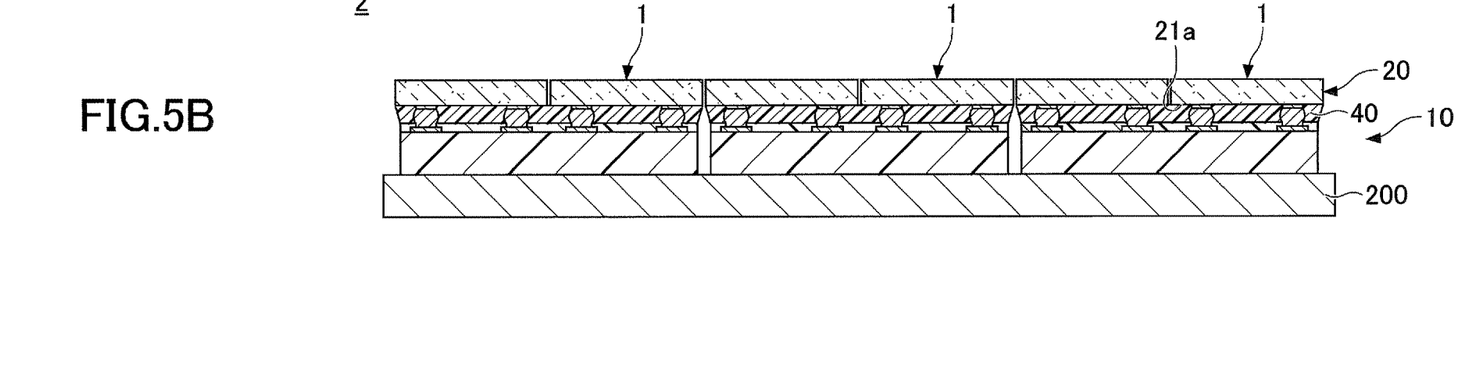

For example, in the case of arranging semiconductor devices 1A into a semiconductor device array as illustrated in FIGS. 5A and 5B as described below, the provision of the opposite region 107 does not affect the interval between adjacent semiconductor devices 1A. Therefore, as illustrated in FIGS. 4A and 4B, the semiconductor device 1A may be provided with the opposite region 107.

The opposite region 107 can serve the same as the resin injection region 102. Therefore, the underfill resin 40 may be poured from the opposite region 107 side. Furthermore, when the number of semiconductor chips 20 per column becomes far greater than three to make it difficult for the underfill resin 40 to reach the vicinity of the center of a column in FIGS. 4A and 4B, the underfill resin 40 may be poured from both the resin injection region 102 side and the opposite region 107 side. That is, in the process of pouring the underfill resin 40 described with reference to FIG. 3D, the underfill resin 40 may be poured from one or both of the resin injection region 102 side and the opposite region 107 of each individual piece region 10C.

Furthermore, as described above, by adjusting the conditions of discharging the underfill resin 40 from the needle 300, it is possible to prevent the underfill resin 40 from flowing out of the opposite side of the individual piece region 10C from the resin injection region 102. The presence of the opposite region 107 on the opposite side from the resin injection region 102 can further reduce the chance of the outflow of the underfill resin 40 from the opposite side from the resin injection region 102.

In terms of size, the semiconductor device 1 may be smaller than the semiconductor device 1A with the opposite region 107.

[b] Second Embodiment

A second embodiment illustrates an example of a semiconductor device array in which semiconductor devices are arranged in an array. In the description of the second embodiment, a description of the same components as those of the above-described embodiment may be omitted.

FIGS. 5A and 5B are a plan view and a sectional view taken along the line 8B-8B of FIG. 5A, respectively of a semiconductor device array 2 according to the second embodiment.

Referring to FIGS. 5A and 5B, the semiconductor device array 2 includes a support 200 and semiconductor devices 1 arranged in an array on the support 200. According to the semiconductor device array 2, the semiconductor devices 1 are arranged on the support 200 such that respective sides of the semiconductor devices 1 from which sides their respective wiring substrates 10 do not protrude are adjacent to each other. While the semiconductor devices 1 are arranged in three columns according to the illustration of FIGS. 5A and 5B, the number of columns of the semiconductor devices 1 is not limited to this. Furthermore, the semiconductor devices 1A may be used in place of the semiconductor devices 1.

The support 200 may be, for example, a wiring substrate, a substrate without wiring, or the enclosure of a predetermined device. The semiconductor devices 1 may be fixed to the support 200 with, for example, an electrically conductive or non-conductive adhesive or with a mechanical fastening member such as a bolt.

As described above, according to the semiconductor devices 1, the outer edge of the wiring substrate 10 except for the outer edge of the resin injection region 102 is positioned inward of the outer edge of the matrix of the semiconductor chips 20. Accordingly, the semiconductor devices 1 can be arranged such that respective sides of the semiconductor devices 1 from which sides their respective wiring substrates 10 do not protrude are adjacent to each other as illustrated in FIGS. 5A and 5B. In this case, an interval G3 between adjacent two of the semiconductor devices 1 may be reduced to approximately 30 μm to approximately 100 μm.

For example, in the case of using the semiconductor device array 2 as an optical detector, glass, a transparent resin or the like may be placed on the back side (opposite side from the circuit formation surface 21a) of the semiconductor chips 20. Such glass, a transparent resin or the like may have functions such as a function of selecting a particular wavelength range and a function of converting a wavelength.

When the semiconductor chips 20 are neither light-emitting elements nor light-receiving elements, a heat dissipating member such as a heat spreader may be placed on the back side of the semiconductor chips 20. In this case, because the interval G3 between adjacent two of the semiconductor devices 1 is limited, the semiconductor device array 2 can be reduced in size with high heat dissipation performance.

Next, a variation of the second embodiment is described. According to the variation, a larger number of semiconductor devices are arranged in an array. In the description of the variation of the second embodiment, a description of the same components as those of the above-described embodiments may be omitted.

Figure 6:
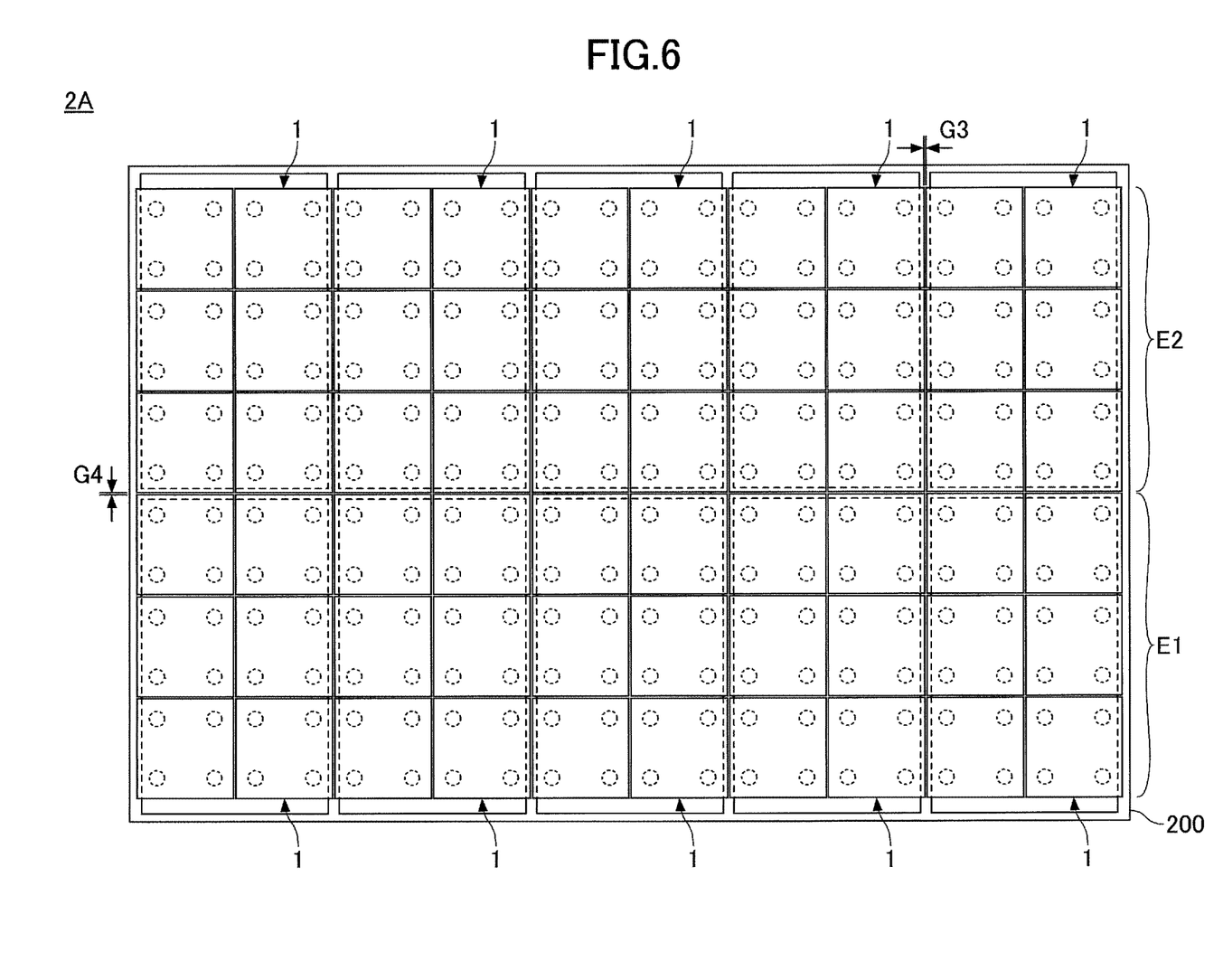
FIG. 6 is a plan view of a semiconductor device array according to a variation of the second embodiment.

FIG. 6 is a plan view of a semiconductor device array 2A according to the variation of the second embodiment. The semiconductor device array 2A has the same sectional structure as illustrated in FIG. 5B.

Accordingly, a graphical representation of the sectional structure is omitted.

Referring to FIG. 6, the semiconductor device array 2A includes the support 200 and semiconductor devices 1 arranged in an array on the support 200.

In a region E1 of the semiconductor device array 2A, the semiconductor devices 1 are arranged in five columns in the same direction as in the semiconductor device array 2. Furthermore, in a region E2 of the semiconductor device array 2A, the semiconductor devices 1 are arranged in five columns with an orientation turned 180° from that in the region E1. While the semiconductor devices 1 are arranged in two rows and five columns according to the illustration of FIG. 6, the number of rows and the number of columns are not limited to this.

According to the arrangement as illustrated in FIG. 6, an interval G4 between the semiconductor devices 1 in adjacent rows may be reduced to, for example, approximately 30 μm to approximately 100 μm, the same as the interval G3 between the semiconductor devices 1 in adjacent columns.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, while the wiring substrate 10 is illustrated as a resin substrate by way of example according to the above-described embodiments, the wiring substrate 10 may alternatively be a ceramic or silicon substrate.

Various aspects of the subject matter described herein may be set out non-exhaustively in the following numbered clauses:

1. A method of manufacturing a semiconductor device, the method including:

making a slit in a wiring substrate having a sheet shape to form a connecting portion and a plurality of individual piece regions protruding in a same direction from the connecting portion;

mounting a plurality of semiconductor chips in each of the individual piece regions by flip chip bonding;

pouring and curing a resin between each of the individual piece regions and the semiconductor chips; and separating the individual piece regions into individual pieces, wherein making the slit forms a chip mounting region in which the semiconductor chips are to be mounted in a matrix, and at least one of a first protruding region protruding from a first end of the chip mounting region and a second protruding region protruding from a second end of the chip mounting region opposite from the first end, in each of the individual piece regions, mounting the semiconductor chips mounts the semiconductor chips in the matrix in the chip mounting region of each of the individual piece regions such that an outer edge of the wiring substrate in the chip mounting region is positioned inward of an outer edge of the semiconductor chips mounted in the matrix and an outer edge of the wiring substrate in the at least one of the first protruding region and the second protruding region protrudes outward of the outer edge of the semiconductor chips arranged in the matrix, and pouring the resin pours the resin from the at least one of the first protruding region and the second protruding region of each of the individual piece regions.

2. The method of clause 1, wherein making the slit forms the first protruding region and the second protruding region such that the first protruding region and the second protruding region are opposite each other across the chip mounting region, and mounting the semiconductor chips mounts the semiconductor chips in the matrix in the chip mounting region of each of the individual piece regions such that the outer edge of the wiring substrate in each of the first protruding region and the second protruding region protrudes outward of the outer edge of the semiconductor chips arranged in the matrix.

3. The method of clause 2, wherein pouring the resin pours the resin from each of the first protruding region and the second protruding region of each of the individual piece regions.

What is claimed is:

1. A semiconductor device comprising:
a wiring substrate; and
a plurality of semiconductor chips mounted on the wiring substrate by flip chip bonding with a resin being interposed between the wiring substrate and the semiconductor chips,
wherein the wiring substrate includes a chip mounting region in which the semiconductor chips are arranged in a form of a matrix, and a resin injection region extending from an end of the chip mounting region,
the chip mounting region is defined by three sides and one side that corresponds to the end of the chip mounting region, and the form of the matrix is defined by three sides and one side that overlaps said one side of the chip mounting region in a plan view,
an entirety of the three sides of the chip mounting region is positioned inward of an entirety of the three sides of the form of the matrix, and the resin injection region protrudes outward of said one side of the form of the matrix in the plan view, the plurality of semiconductor chips include a first semiconductor chip and a second semiconductor chip, a perimeter of each of the first semiconductor chip and the second semiconductor chip is defined by first and second opposite sides and third and fourth opposite sides each connecting the first and second opposite sides, a perimeter of the wiring substrate is defined by first and second opposite sides and third and fourth opposite sides each connecting the first and second opposite sides of the wiring substrate, an entirety of the first side of the first semiconductor chip is positioned outward of the first side of the wiring substrate, an entirety of the first side of the second semiconductor chip is positioned outward of the first side of the wiring substrate and an entirety of the third side of the second semiconductor chip is positioned outward of the third side of the wiring substrate, and the third side of the first semiconductor chip faces the fourth side of the second semiconductor chip.

2. The semiconductor device as claimed in claim 1, wherein an amount of protrusion of the resin injection region from said one side of the form of the matrix is more than or equal to 1 mm.

3. A semiconductor device array comprising:

a support; and a plurality of semiconductor devices each being the semiconductor device as set forth in claim 1, the semiconductor devices being arranged on the support such that respective sides of the semiconductor devices from which sides the respective wiring substrates do not protrude are adjacent to each other.

4. A semiconductor device comprising:

a wiring substrate; and a plurality of semiconductor chips of a same size mounted on the wiring substrate by flip chip bonding with a resin being interposed between the wiring substrate and the semiconductor chips, wherein the wiring substrate includes a chip mounting region in which the semiconductor chips are arranged in a form of a matrix of m rows and n columns, where m and n are natural numbers, at least one of m and n is greater than one, and each of the m rows has a same number of semiconductor chips and each of n columns has a same number of semiconductor chips, and a resin injection region extending from an end of the chip mounting region, the chip mounting region is defined by three sides and one side that corresponds to the end of the chip mounting region, and the form of the matrix is defined by three sides and one side that overlaps said one side of the chip mounting region in a plan view, and an entirety of the three sides of the chip mounting region is positioned inward of an entirety of the three sides of the form of the matrix, and the resin injection region protrudes outward of said one side of the form of the matrix in the plan view.

5. The semiconductor device as claimed in claim 4, wherein the three sides and said one side of the form of the matrix form a line connecting sides of the semiconductor chips, the sides not facing adjacent semiconductor chips among the semiconductor chips.

6. The semiconductor device as claimed in claim 4, wherein an amount of protrusion of the resin injection region from said one side of the form of the matrix is more than or equal to 1 mm.

7. A semiconductor device array comprising:

a support; and a plurality of semiconductor devices each being the semiconductor device as set forth in claim 4, the semiconductor devices being arranged on the support such that respective sides of the semiconductor devices from which sides the respective wiring substrates do not protrude are adjacent to each other.

* * * * *